(12) United States Patent
Abdallah et al.

(10) Patent No.: US 8,084,186 B2
(45) Date of Patent: Dec. 27, 2011

(54) HARDMASK PROCESS FOR FORMING A REVERSE TONE IMAGE USING POLYSILAZANE

(75) Inventors: David Abdallah, Bernardsville, NJ (US); Ralph R. Dammel, Flemington, NJ (US); Yusuke Takano, Kakegawa (JP); Jin Li, Kakegawa (JP); Kazunori Kurosawa, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 158 days.

(21) Appl. No.: 12/368,720

(22) Filed: Feb. 10, 2009

(65) Prior Publication Data

US 2010/0203299 A1    Aug. 12, 2010

(51) Int. Cl.
G03F 7/00 (2006.01)
G03F 7/004 (2006.01)
G03F 7/26 (2006.01)
G03F 7/40 (2006.01)

(52) U.S. Cl. ............... 430/270.1; 430/273.1; 430/311; 430/313; 430/317; 430/322; 430/330; 430/331

(58) Field of Classification Search ......... 430/270.1, 430/311, 312, 314, 317, 322, 330, 331
See application file for complete search history.

(56) References Cited

U.S. PATENT DOCUMENTS

| | | | |
|---|---|---|---|
| 4,151,313 A | 4/1979 | Wajima et al. | |
| 4,491,628 A | 1/1985 | Ito et al. | |
| 4,770,974 A * | 9/1988 | Hiraoka | 430/270.1 |
| 4,818,611 A | 4/1989 | Arai et al. | |
| 4,869,858 A | 9/1989 | Funayama et al. | |
| 4,965,058 A | 10/1990 | Funayama et al. | |
| 4,999,280 A * | 3/1991 | Hiraoka | 430/330 |
| 5,292,830 A | 3/1994 | Funayama et al. | |
| 5,350,485 A | 9/1994 | Shiraishi et al. | |
| 5,350,660 A | 9/1994 | Urano et al. | |

(Continued)

FOREIGN PATENT DOCUMENTS

EP    1164435 A1 * 12/2001

(Continued)

OTHER PUBLICATIONS

Form PCT/ISA/220, Form PCT/ISA/210, and Form PCT/ISA/237 mailed Feb. 19, 2010 for PCT/IB2009/005143, which corresponds to U.S. Appl. No. 12/356,568.

(Continued)

*Primary Examiner* — Amanda C. Walke
(74) *Attorney, Agent, or Firm* — Sangya Jain

(57) ABSTRACT

The present invention relates to a process for forming an reverse tone image on a device comprising; a) forming an optional absorbing organic underlayer on a substrate; b) forming a coating of a photoresist over the underlayer; c) forming a photoresist pattern; d) forming a polysilazane coating over the photoresist pattern from a polysilazane coating composition, where the polysilazane coating is thicker than the photoresist pattern, and further where the polysilazane coating composition comprises a silicon/nitrogen polymer and an organic coating solvent; e) etching the polysilazane coating to remove the polysilazane coating at least up to a level of the top of the photoresist such that the photoresist pattern is revealed; and, f) dry etching to remove the photoresist and the underlayer which is beneath the photoresist, thereby forming an opening beneath where the photoresist pattern was present.

The invention further relates to a product of the above process and to a microelectronic device made from using the above process.

15 Claims, 4 Drawing Sheets

Model of polysilazane swelling during oxidative etching

U.S. PATENT DOCUMENTS

| | | | | |
|---|---|---|---|---|
| 5,770,260 A * | 6/1998 | Fukuyama et al. | | 427/226 |
| 5,770,271 A * | 6/1998 | Imamura | | 427/412.1 |
| 5,843,624 A | 12/1998 | Houlihan et al. | | |
| 5,858,620 A | 1/1999 | Ishibashi et al. | | |
| 5,863,707 A | 1/1999 | Lin | | |
| 5,922,411 A | 7/1999 | Shimizu et al. | | |
| 5,976,618 A * | 11/1999 | Fukuyama et al. | | 427/226 |
| 6,015,650 A | 1/2000 | Bae | | |
| 6,111,015 A | 8/2000 | Eldin et al. | | |
| 6,114,085 A | 9/2000 | Padmanaban et al. | | |
| 6,221,562 B1 * | 4/2001 | Boyd et al. | | 430/314 |
| 6,303,524 B1 | 10/2001 | Sharangpani et al. | | |
| 6,447,980 B1 | 9/2002 | Rahman et al. | | |
| 6,686,124 B1 | 2/2004 | Angelopoulos et al. | | |
| 6,723,488 B2 | 4/2004 | Kudo et al. | | |
| 6,737,492 B2 | 5/2004 | Kang et al. | | |
| 6,767,641 B1 | 7/2004 | Shimizu et al. | | |
| 6,780,569 B1 | 8/2004 | Hudson et al. | | |
| 6,790,587 B1 | 9/2004 | Feiring et al. | | |
| 6,818,258 B2 | 11/2004 | Kaneko et al. | | |
| 6,849,377 B2 | 2/2005 | Feiring et al. | | |
| 6,866,984 B2 | 3/2005 | Jung et al. | | |
| 6,916,590 B2 | 7/2005 | Kaneko et al. | | |
| 6,995,056 B2 * | 2/2006 | Lee et al. | | 438/233 |
| 7,015,144 B2 * | 3/2006 | Hong et al. | | 438/694 |
| 7,053,005 B2 * | 5/2006 | Lee et al. | | 438/758 |
| 7,125,926 B2 * | 10/2006 | Satoh et al. | | 524/502 |
| 7,179,537 B2 * | 2/2007 | Lee et al. | | 428/447 |
| 7,344,603 B2 | 3/2008 | Shimizu et al. | | |
| 7,521,170 B2 | 4/2009 | Rahman et al. | | |
| 7,528,200 B2 | 5/2009 | Schile | | |
| 7,704,670 B2 | 4/2010 | Abdallah et al. | | |
| 2001/0036593 A1 | 11/2001 | Takeda et al. | | |
| 2002/0028408 A1 | 3/2002 | Mao et al. | | |
| 2002/0045125 A1 | 4/2002 | Shao et al. | | |
| 2002/0064936 A1 | 5/2002 | Park et al. | | |
| 2002/0128410 A1 | 9/2002 | Jung et al. | | |
| 2002/0137826 A1 | 9/2002 | Jung et al. | | |
| 2002/0142246 A1 | 10/2002 | Gronbeck et al. | | |
| 2002/0156148 A1 | 10/2002 | Arase et al. | | |
| 2003/0204035 A1 | 10/2003 | De et al. | | |
| 2003/0220431 A1 | 11/2003 | Xu et al. | | |
| 2004/0023156 A1 | 2/2004 | McGinness et al. | | |
| 2004/0048761 A1 | 3/2004 | Ikemoto | | |
| 2004/0067441 A1 | 4/2004 | Shao et al. | | |
| 2004/0102048 A1 * | 5/2004 | Yamaguchi | | 438/694 |
| 2004/0110089 A1 | 6/2004 | Neef et al. | | |
| 2004/0209200 A1 | 10/2004 | Wayton et al. | | |
| 2005/0069814 A1 | 3/2005 | Endo et al. | | |
| 2005/0164133 A1 * | 7/2005 | Rangarajan et al. | | 430/322 |
| 2005/0277058 A1 | 12/2005 | Iwabuchi et al. | | |
| 2006/0228895 A1 | 10/2006 | Chae et al. | | |
| 2007/0048670 A1 | 3/2007 | Choi et al. | | |
| 2007/0179257 A1 | 8/2007 | Schile | | |
| 2007/0298349 A1 | 12/2007 | Zhang et al. | | |
| 2008/0020328 A1 | 1/2008 | Suggeta et al. | | |
| 2008/0160459 A1 * | 7/2008 | Lin | | 430/323 |
| 2008/0166665 A1 * | 7/2008 | Jung | | 430/313 |
| 2008/0193880 A1 | 8/2008 | Nishibe et al. | | |
| 2008/0196626 A1 | 8/2008 | Wu et al. | | |
| 2008/0199814 A1 | 8/2008 | Brzozowy et al. | | |
| 2008/0248427 A1 | 10/2008 | Thiyagarajan et al. | | |
| 2008/0292995 A1 | 11/2008 | Houlihan et al. | | |
| 2009/0011374 A1 | 1/2009 | Change et al. | | |
| 2009/0029191 A1 | 1/2009 | Albrecht | | |
| 2009/0042148 A1 | 2/2009 | Padmanaban et al. | | |
| 2009/0081379 A1 | 3/2009 | Nawrocki et al. | | |
| 2009/0123701 A1 | 5/2009 | Fu et al. | | |
| 2009/0142701 A1 * | 6/2009 | Hsu et al. | | 430/296 |
| 2009/0246691 A1 | 10/2009 | Rahman et al. | | |
| 2009/0253080 A1 | 10/2009 | Dammel et al. | | |
| 2009/0253081 A1 * | 10/2009 | Abdallah et al. | | 430/324 |
| 2009/0258318 A1 * | 10/2009 | Chan | | 430/312 |
| 2009/0280435 A1 | 11/2009 | McKenzie et al. | | |
| 2010/0035177 A1 | 2/2010 | Ishikawa et al. | | |
| 2010/0040838 A1 | 2/2010 | Abdallah et al. | | |
| 2010/0119717 A1 | 5/2010 | Hong et al. | | |
| 2010/0130016 A1 | 5/2010 | DeVilliers | | |
| 2010/0183851 A1 | 7/2010 | Cao et al. | | |
| 2010/0308015 A1 | 12/2010 | Takano et al. | | |

FOREIGN PATENT DOCUMENTS

| | | | | |
|---|---|---|---|---|
| EP | 2 128 706 A1 | | 12/2009 | |
| JP | 2-5522 A | | 1/1990 | |
| JP | 5-13384 A | | 1/1993 | |
| JP | 6-216084 A | | 8/1994 | |
| JP | 7-130631 A | | 5/1995 | |
| JP | 2000181069 A | * | 6/2000 | |
| JP | 2003-31486 A | | 1/2003 | |
| JP | 2009-25815 A | | 2/2009 | |
| WO | WO 2008/059440 A2 | | 5/2008 | |

OTHER PUBLICATIONS

Masafumi Hori et al, "Sub-40nm Half-Pitch Double Patterning with Resist Freezing Process", SPIE vol. 6923, 69230H, pp. 69230H-1-pp. 69230H-8 (2008) XP-002565387.

Shun-Ichi Kodama et al., "Synthesis of Novel Fluoropolymer for 157nm Photoresists by Cyclo-polymerization", SPIE vol. 4690, pp. 76-pp. 83 (2002).

M. Maenhoudt et al., "Alternative process schemes for double patterning that eliminate the intermediate etch step", SPIE vol. 6974, 69740P, pp. 69240P-1-pp. 69249P-12 (2008) XP-002565388.

A. Valeenhove et al., "A litho-only approach to double patterning", SPIE vol. 6520, 65202F, pp. 65202F-1-pp. 65202F-10 (2007) XP-002565386.

Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB2009/005170 mailed Jul. 28, 2009, which corresponds to U.S. Appl. No. 12/061,061.

International Search Report (Form PCT/ISA/210), and Written Opinion of the International Searching Authority (Form PCT/ISA/237) for PCT/IB2009/005172 mailed Jul. 8, 2009, which corresponds to U.S. Appl. No. 12/061,111.

Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB2009/005146 mailed Jul. 15, 2009, which corresponds to U.S. Appl. No. 12/192,621.

David J. Abdallah et al., "A Novel Resist Freeze Process for Double Imaging", Journal of Photopolymer Science and Technology, (2008), pp. 655-pp. 663, vol. 21, No. 5, XP002533190.

Form PCT/ISA/220, Form PCT/ISA/210, and Form PCT/ISA/237 for PCT/IB2009/005145 dated Oct. 19, 2009, which corresponds to U.S. Appl. No. 12/368,720.

Office Action dated. Sep. 23, 2010 for U.S. Appl. No. 12/061,061.

Form PCT/IB/326, Form PCT/IB/373, and Form PCT/ISA/237 for PCT/IB2009/005170 dated Oct. 14, 2010, which corresponds to U.S. Appl. No. 12/061,061.

Form PCT/IB/326, Form PCT/IB/373, and Form PCT/ISA/237 for PCT/IB2009/005172 dated Oct. 14, 2010, which corresponds to U.S. Appl. No. 12/061,111.

Office Action dated Oct. 28, 2010 for U.S. Appl. No. 12/192,621.
Office Action dated Nov. 23, 2010 for U.S. Appl. No. 12/356,568.
Office Action mail date Apr. 4, 2011 for U.S. Appl. No. 12/061,061.
Office Action mail date Jun. 8, 2011 for U.S. Appl. No. 12/061,111.
Office Action mail date Apr. 12, 2011 for U.S. Appl. No. 12/192,621.
Office Action mail date May 9, 2011 for U.S. Appl. No. 12/356,568.
Advisory Action mail date Jul. 13, 2011 for U.S. Appl. No. 12/192,621.

Form PCT/IB/326, Form PCT/IB/373, Form PCT/ISA/237 for PCT/IB2009/005143 mailed Aug. 4, 2011, which corresponds to U.S. Appl. No. 12/356,568.

English Language Abstract from JPO of JP 2-5522 A.

International Search Report (Form PCT/ISA/220), for PCT/IB2009/051234 mailed Mar. 31, 2009, which corresponds to U.S. Appl. No. 12/864,259.

Chris Bencher, "SADP: The Best Option for ≦32nm NAND Flash", Nanochip Technology Journal, Issue Two 2007.

Mircea Dusa et al., "Pitch Doubling Through Dual Patterning Lithography Challenges in Integration and Lithography Budgets", SPIE vol. 6520, pp. 65200G-1-pp. 65200G-10 (2007).

Communication pursuant to Rules 161(1) and 162 EPC (EPO Form 1226AA) dated Sep. 1, 2011 for EP 077414122, along Form PCT/IB/373 issued Jul. 26, 2011 and Form PCT/ISA/237 mailed Aug. 1, 2011 for PCT/IB2009/005143, which correspond to U.S. Appl. No. 12/356,568.

Final Office Action dated Oct. 25, 2011 for U.S. Appl. No. 12/061,061.

Form PCT/IB/326, Form PCT/IB/373, and Form PCT/ISA/237 for PCT/IB2009/005145 dated Aug. 25, 2011, which corresponds to 12/368,720.

* cited by examiner

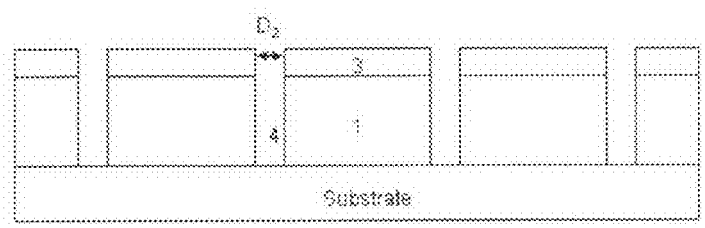
Figure 7
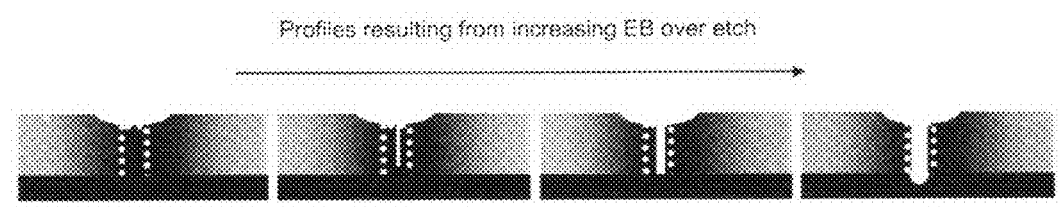
Figure 8
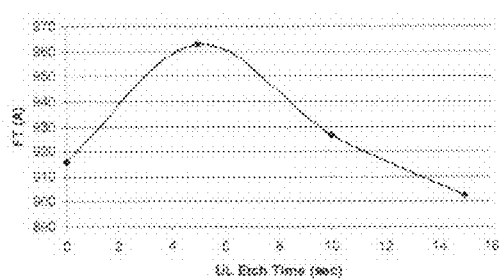
Figure 9. VASE study on the CUL etching of SiHM

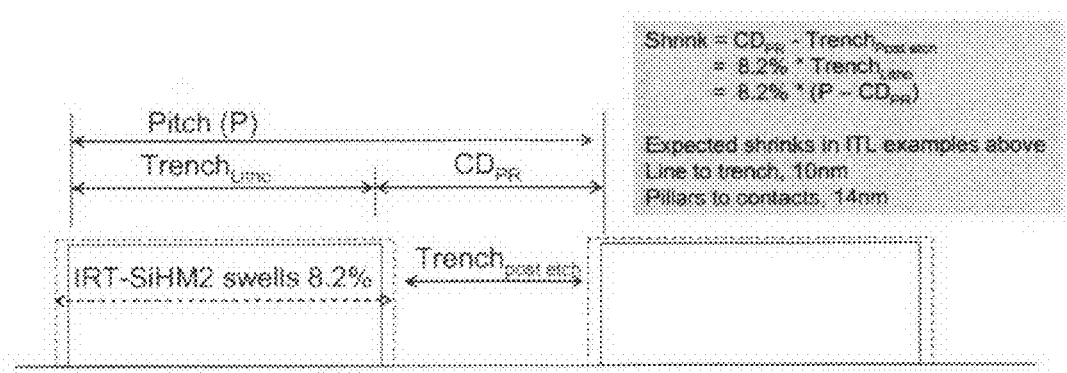
Figure 10. Model of polysilazane swelling during oxidative etching

HARDMASK PROCESS FOR FORMING A REVERSE TONE IMAGE USING POLYSILAZANE

FIELD OF INVENTION

The present invention relates to a process for forming fine patterns on a device using a reverse tone hard mask imaging process.

DESCRIPTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam, extreme ultraviolet (euv) and X-ray radiant energy are radiation types commonly used today in microlithographic processes. After this image-wise exposure, the coated substrate is optionally baked, and then treated with a developer solution to dissolve and remove either the radiation exposed (positive photoresist) or the unexposed areas of the photoresist (negative photoresist).

Positive working photoresists when they are exposed image-wise to radiation have those areas of the photoresist composition exposed to the radiation become more soluble to the developer solution while those areas not exposed remain relatively insoluble to the developer solution. A postexposure bake may be used to treat the photoresist imaged portions. Treatment of an exposed positive-working photoresist with the developer causes removal of the exposed areas of the coating and the formation of a positive image in the photoresist coating. Again, a desired portion of the underlying surface is uncovered.

Photoresists sensitive to short wavelengths, between about 100 nm and about 300 nm, are often used where subhalfmicron geometries are required. Particularly preferred are deep uv photoresists sensitive at below 200 nm, e.g. 193 nm and 157 nm, comprising non-aromatic polymers, a photoacid generator, optionally a dissolution inhibitor, base quencher and solvent. High resolution, chemically amplified, deep ultraviolet (100-300 nm) positive tone photoresists are available for patterning images with less than quarter micron geometries. Photoresists useful for imprinting technology can also be used.

Photoresists are used to form mask patterns on a substrate and the substrate is further etched in the open areas to form patterns in the substrate. However there is a need to provide for very narrow and deep trenches or holes in the substrate using photoresists. Also, hard mask patterning using positive photoresist has been found to give high resolution patterns over the substrate.

The present invention relates to a method of forming a pattern on a device such that a reverse tone pattern is formed on a substrate; the process uses a photoresist pattern with a coating of polysilazane coated over the photoresist which acts as a precursor hard mask for etching the pattern into the substrate. The polysilazane formulation uses a solvent not compatible with a photoresist so that the patterned photoresist does not dissolve during applications; thus the photoresist pattern does not necessarily need an insolubilizing treatment step prior to the polysilazane coating step, but an insolubilizing step may be applied. The polysilazane film is turned into an oxidized silicon hard mask during the processing. Advantageously, it is not necessary to treat the patterned photoresist before coating the polysilazane over the photoresist pattern. Silicon hard mask technology allows for the formation of very deep and narrow trenches or holes to be formed in the substrate.

SUMMARY OF THE INVENTION

The present invention relates to a process for forming a reverse tone image on a device comprising;
   a) optionally forming an absorbing organic underlayer on a substrate;
   b) forming a coating of a photoresist over the underlayer or substrate;
   c) forming a photoresist pattern in the photoresist layer;
   d) forming a polysilazane coating over the photoresist pattern from a polysilazane coating composition, where the polysilazane coating is thicker than the photoresist pattern, and further where the polysilazane coating composition comprises a silicon/nitrogen polymer and an organic coating solvent;
   e) etching the polysilazane coating to remove the polysilazane coating at least up to a level where the top of the photoresist pattern is revealed; and,
   f) dry etching to remove the photoresist and the optional underlayer which is beneath the photoresist, thereby forming an opening beneath where the photoresist pattern was present.

The invention further relates to a product of the above process and to a microelectronic device made from using the above process.

BRIEF DESCRIPTION OF THE DRAWINGS

FIG. 7 shows the reverse tone underlayer hard mask pattern after the transfer of the image in the polysilazane layer to the underlayer for etching the substrate.

FIG. 8 shows the different extent of etch into the photoresist pattern.

FIG. 9 shows VASE study on the underlayer CUL etching of the polysilazane SiHM

FIG. 10 show the geometric model of SiHM polysilazane swelling during oxidative etching

DETAILED DESCRIPTION OF THE INVENTION

The present invention relates to an inventive process for imaging fine patterns on an electronic device, especially a microelectronic device, using a reverse tone multilayer imaging process comprising a method of using a polysilazane coating which can be converted into a Si/O/N/H glass or silicon hard mask, thus forming a hard mask which is resistant to an oxidative dry etch. The present invention also relates to the product made from using the inventive process and further relates to a microelectronic device made from the inventive process.

Specifically the present invention relates to a process for forming a reverse tone image on a device comprising;

a) optionally forming an absorbing organic underlayer (1) on a substrate;

b) forming a coating of a photoresist (2) over the underlayer or substrate;

c) forming a photoresist pattern in the photoresist layer;

d) forming a polysilazane coating (3) over the photoresist pattern from a polysilazane coating composition, where the polysilazane coating has a higher film thickness than the film thickness of the photoresist pattern, and further where the polysilazane coating composition comprises a silicon/nitrogen polymer and an organic coating solvent;

e) etching the polysilazane coating to remove the polysilazane coating at least up to a level where the top of the photoresist pattern is revealed; and, f) dry etching to remove the photoresist and the optional underlayer which is beneath the photoresist to the substrate, thereby forming an opening or groove (4) beneath where the photoresist pattern was present.

Figure 6:
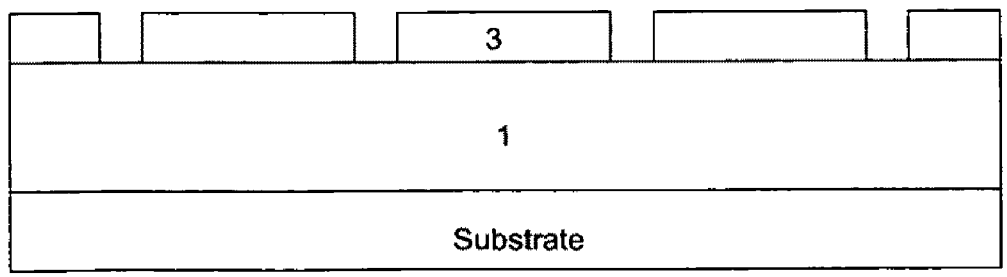
FIG. 6 shows the reverse tone polysilazane coating which is converted into a hard mask after the removal of the photoresist pattern.

FIGS. 1-8 briefly describe the present inventive process of forming the reverse tone silicon hard mask. In one embodiment a relatively thick layer of an absorbing underlayer coating (1) is formed on a substrate as shown, in FIG. 1. The underlayer is then coated with a positive photoresist layer (2) as in FIG. 2. In another embodiment the photoresist may be coated directly over the substrate. Thus, the photoresist is coated over an underlayer or over a substrate. The photoresist film is then patterned. The patterning may comprise the steps of imagewise exposing and developing the photoresist coating to form a photoresist pattern as in FIG. 3. A silicon layer (3) from a polysilazane composition is formed to give a film thickness greater than the film thickness of the photoresist pattern in the patterned area as in FIG. 4, thereby essentially forming a planarized polysilazane layer and covering the photoresist pattern. The polysilazane layer is optionally baked conventionally to remove the solvent (such as hotplate or oven) or baked in a humidity chamber to convert the polysilazane to a highly oxidized silicon film which can function as a hard mask. The polysilazane layer (3) is then etched back using a first etching process step to reduce the polysilazane layer to at least a level approximately equal to the thickness of the photoresist pattern, such that the top of photoresist pattern is revealed (FIG. 5), that is, the photoresist surface is now exposed for further treatment. The tops of the photoresist pattern are revealed and the portion where the photoresist is not present is covered with the silicon coating. Optionally, the first etching step may be extended further to where the photoresist is partially or fully removed and the portion Where the photoresist is not present is covered with the silicon coating. The extended first etch back step is shown in FIG. 8, where the etch time is increased to widen the groove in the photoresist. Thus, the polysilazane or converted polysilazane coating (3) is not completely removed, and can thus act as a silicon hard mask for the subsequent oxidative second etching step where the underlayer is present. The photoresist may be removed to form an opening in the first etching step or may be removed in the second etching step. A second etching step is an anisotropic dry etch in an environment which removes the organic layer(s) of photoresist and/or underlayer, but the silicon coating (3) is essentially not removed and can act as hard mask for the second or subsequent etching steps. FIG. 6 shows where the photoresist is removed. The etching can proceed further where both the photoresist and the underlayer are removed, forming the groove 4, as shown in FIG. 7. Thus, a reverse tone pattern is formed by removing the photoresist pattern and forming a groove underneath where the photoresist was present. The second etching step can further convert the polysilazane film into a $SiO_2$ rich Si/O/N/H coating (3) in the second dry etching step, if this has not previously been done, thus forming a pattern of silicon coating which forms a silicon hard mask for the further etching of the organic underlayer (FIG. 7). Alternatively if the underlayer is not present, the photoresist is removed as described above, leaving the polysilazane on the substrate; during the photoresist removal in a second oxidative dry etching step the polysilazane expands forming an opening which is narrower than the photoresist dimensions, i.e. shrinking the opening. In the embodiment where the underlayer is present, the underlayer can then be further patterned by the second dry etching process with the use of the patterned silicon hard mask, thus forming a deep reverse tone pattern relative to the positive photoresist pattern over the substrate. A deep trench (4) is formed in the silicon/underlayer coating underneath where the positive photoresist pattern used to be, that is, a reverse tone hard mask is formed. The photoresist and the underlayer may be etched in separate dry etching steps or in one continuous dry etching step since both the photoresist and the underlayer are highly carbonaceous organic materials which are etchable with an oxidative gas comprising oxygen and/or hydrogen. The substrate is further etched to form the desired high resolution opening in the substrate using the silicon/underlayer pattern as a hard mask.

The polysilazane composition comprises a solvent incompatible with the photoresist so that the patterned photoresist does not dissolve during applications and a uniform coating is obtained; thus the photoresist pattern does not always need an insolubilizing treatment step prior to the polysilazane coating step. However, freezing the photoresist prior to coating with the polysilazane may be done to control the level of intermixing of the photoresist and polysilazane surfaces which may occur during baking. Baking the polysilazane coatings helps to remove the solvent. In one embodiment, the intermixing of the photoresist with the polysilazane coating at the sidewalls of the photoresist pattern can be beneficial to create a change in the final opening of the silicon hard mask by controlling the first etch step, as illustrated in FIG. 8. During oxidative etching the polysilazane film is partially turned into a silicon-oxide hard mask during the pattern transfer etch processing. Thus the silicon hard mask is not etched while the photoresist and/or the underlayer are removed. In one embodiment of the inventive process, the process described herein is free of a photoresist insolubilizing, freezing or crosslinking step prior to the coating of the polysilazane.

The substrates over which the underlayer coating is formed can be any of those typically used In the semiconductor industry. Suitable substrates include, without limitation, silicon, silicon substrate coated with a metal surface, copper coated silicon wafer, copper, aluminum, polymeric resins, silicon dioxide, metals, doped silicon dioxide, silicon nitride, siliconoxynitride, quartz, fused silica, sapphire, organic polymers, borosilicate glass, tantalum, polysilicon, ceramics, aluminum/copper mixtures; gallium arsenide and other such Group III/V compounds. The substrate may comprise any number of layers made from the materials described above.

The coatings may be inorganic, organic or mixture of these. The substrate may be those useful in integrated circuits or MEMS devices.

When the underlayer coating (layer 1 in FIGS. 1-7) is formed on the substrate, it is typically an organic spin coatable antireflective coating composition. The underlayer composition comprises an absorbing underlayer polymer and an organic solvent. The composition may further comprise additives selected from a thermal acid generator, a crosslinker, a photoacid generator, a surfactant, a secondary organic polymer and mixtures thereof. The composition may comprise an absorbing polymer absorbing at the radiation of exposure, a crosslinker and a thermal acid generator. The thickness of the underlayer is greater than the thickness of the photoresist coated above the underlayer. In one embodiment of the underlayer, the underlayer has carbon content greater than 80 weight % of solids. Such high carbon content coatings are described in U.S. patent application with Ser. No. 11/872,962 filed Oct. 16, 2008, U.S. patent application Ser. No. 12/060,307 filed Apr. 1, 2008, U.S. patent application Ser. No. 12/115,776 filed May 6, 2008; U.S. Pat. Nos. 6,686,124, 6,737,492, and US 2003/0204035 and incorporated herein in their entirety by reference.

In one embodiment of the underlayer polymer, the polymer may be an acrylate polymer with a chromophore of at least 2 fused rings pendant from the backbone of the polymer, for example naphthyl and/or anthracyl group. The monomeric units may be derived from monomers such as 9-anthracenylmethyl methacrylate, 2-hydroxypropylmethacrylate, acetoxyethyl methacrylate, n-butylmethacrylate and their equivalents. An example is poly(9-anthracenylmethyl methacrylate/2-hydroxypropylmethacrylate/acetoxyethyl methacrylate/n-butylmethacrylate).

In another embodiment of the underlayer polymer, the polymer may comprise at least 3 fused rings in the backbone of the polymer. The fused aromatic unit may have in the range of about 3 to about 8 aromatic rings. The underlayer polymer comprises at least one unit with three or more fused aromatic rings in the backbone of the polymer and at least one unit with an aliphatic moiety in the backbone of the polymer. Other comonomeric units may also be present, such as substituted or unsubstituted phenyl, or substituted or unsubstituted naphthyl. In one embodiment the polymer may be free of any phenyl or single ring aromatic moiety. The fused aromatic rings provide the absorption for the coating, and are the absorbing chromophore. The fused aromatic rings of the polymer can comprise substituted or unsubstituted 6 membered aromatic rings which have a common bond to form a fused ring structure, such as units exemplified by structures 1-6 and their isomers,

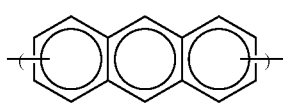

1

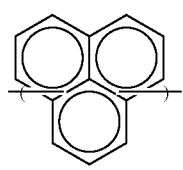

2

-continued

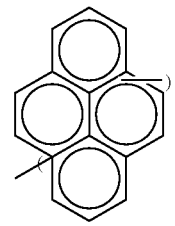

3

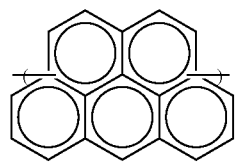

4

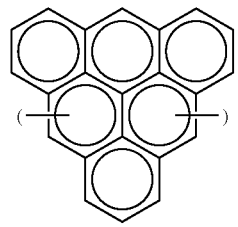

5

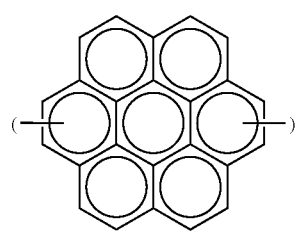

6

The fused rings may be exemplified by anthracene, phenanthrene, pyrene, fluoranthene, coronene triphenylene and their substituted derivatives.

The fused rings may form the backbone of the underlayer polymer at any site in the aromatic structure and the attachment sites may vary within the polymer. The fused ring structure can have more than 2 points of attachment forming a branched oligomer or branched polymer. In one embodiment of the underlayer polymer the number of fused aromatic rings may vary from 3-8, and in other embodiment of the polymer it comprises 4 or more fused aromatic rings, and more specifically the polymer may comprise pyrene as shown in structure 3. The fused aromatic rings may comprise one or more hetero-aromatic rings, where the heteroatom may be nitrogen or sulfur, as illustrated by structure 7.

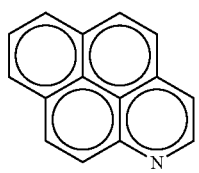

7

In one embodiment of the underlayer polymer, the polymer comprises the fused aromatic unit described previously and further, in order to isolate the chromophore, the fused aromatic unit is connected to an aliphatic carbon moiety. The fused aromatic rings of the polymer may be unsubstituted or substituted with one or more organo substituents, such as alkyl, alkylaryls, ethers, haloalkyls, carboxylic acid, ester of carboxylic acid, alkylcarbonates, alkylaldehydes, ketones. Further examples of substituents are —CH$_2$—OH, —CH$_2$Cl, —CH$_2$Br, —CH$_2$Oalkyl, —CH$_2$—O—C=O(alkyl), —CH$_2$—O—C=O(O-alkyl), —CH(alkyl)-OH, —CH(alkyl)—Cl, —CH(alkyl)-Br, —CH(alkyl)-O-alkyl, —CH(alkyl)-O—C=O-alkyl, —CH(alkyl)-O—C=O(O-alkyl), —HC=O, -alkyl-CO$_2$H, alkyl-C=O(O-alkyl), -alkyl-OH, -alkyl-halo, -alkyl-O—C=O(alkyl), -alkyl-O—C=O(O-alkyl), alkyl-HC=O. In one embodiment of the polymer, the fused aromatic group is free of any pendant moiety containing nitrogen. The substituents on the aromatic rings may aid in the solubility of the polymer in the coating solvent. Some of the substituents on the fused aromatic structure may also be thermolysed during curing, such that they may not remain in the cured coating and may still give a high carbon content film useful during the etching process. The fused aromatic groups are more generally illustrated by structures 1' to 6', where R$_a$ is an organo substituent, such as hydrogen, hydroxy, hydroxy alkylaryl, alkyl, alkylaryl, carboxylic acid, ester of carboxylic acid, etc., and n is the number of substituents on the rings. The substituents, n, may range from 1-12. Typically n can range from 1-5, where Ra, exclusive of hydrogen, is a substituent independently selected from groups such as alkyl, hydroxy, hydroxyalkyl, hydroxyalkylaryl, alkylaryl, ethers, haloalkyls, alkoxy, carboxylic acid, ester of carboxylic acid, alkylcarbonates, alkylaldehydes, ketones. Further examples of substituents are —CH$_2$—OH, —CH$_2$Cl, —CH$_2$Br, —CH$_2$Oalkyl, —CH$_2$—O—C=O(alkyl), —CH$_2$—O—C=O(O-alkyl), —CH(alkyl)-OH, —CH(alkyl)-Cl, —CH(alkyl)-Br, —CH(alkyl)-O-alkyl, —CH(alkyl)-O—C=O-alkyl, —CH(alkyl)-O—C=O(O-alkyl), —HC=O, -alkyl-CO$_2$H, alkyl-C=O(O-alkyl), -alkyl-OH, -alkyl-halo, -alkyl-O—C=O(alkyl), -alkyl-O—C=O(O-alkyl), alkyl-HC=O.

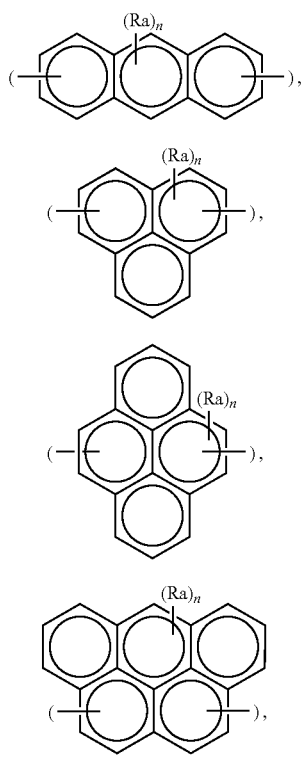

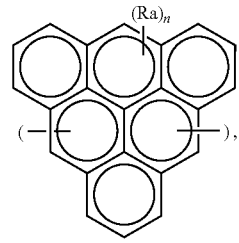

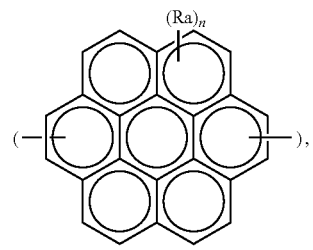

The polymer may comprise more than one type of the fused aromatic structures described herein.

In addition to the fused aromatic unit described above, the underlayer polymer of the novel antireflective coating further comprises at least one unit with an essentially aliphatic moiety in the backbone of the polymer, and the moiety is any that has a nonaromatic structure that forms the backbone of the polymer, such as an alkylene which is primarily a carbon/hydrogen nonaromatic moiety.

The polymer can comprise at least one unit which forms only an aliphatic backbone in the polymer, and the polymer may be described by comprising units, —(A)— and —(B)—, where A is any fused aromatic unit described previously, which may be linear or branched, and where B has only an aliphatic backbone. B may further have pendant substituted or unsubstituted aryl or aralkyl groups or be connected to form a branched polymer. The alkylene, aliphatic moiety in the polymer may be selected from a moiety which is linear, branched, cyclic or a mixture thereof. Multiple types of the alkylene units may be in the polymer. The alkylene backbone unit may have some pendant groups present, such as hydroxy, hydroxyalkyl, alkyl, alkene, alkenealkyl, alkylalkyne, alkyne, alkoxy, aryl, alkylaryl, aralkyl ester, ether, carbonate, halo (e.g. Cl, Br). Pendant groups can impart useful properties to the polymer. Some of the pendant groups may be thermally eliminated during curing to give a polymer with high carbon content, for example through crosslinking or elimination to form an unsaturated bond. Alkylene groups such as hydroxyadamantylene, hydroxycyclohexylene, olefinic cycloaliphatic moiety, may be present in the backbone of the polymer. These groups can also provide crosslinking sites for crosslinking the polymer during the curing step. Pendant groups on the alkylene moiety, such as those described previously, can enhance solubility of the polymer in organic solvents, such as coating solvents of the composition or solvents useful for edge bead removal. More specific groups of the aliphatic comonomeric unit are exemplified by adamantylene, dicyclopentylene, and hydroxy adamantylene. Different or the same alkylene group may be connected together to form a block unit and this block unit may be then connected to the unit comprising the fused aromatic rings. In some cases a block copolymer may be formed, in some case a random copolymer may be formed, and in other cases alternating copolymers may be formed. The copolymer may comprise at least 2 different aliphatic comonomeric units. The copolymer may comprise at least 2 different fused aromatic moieties. In one embodiment the polymer may comprise at least 2 different aliphatic comonomeric units and at least 2 different fused aromatic moieties. In another embodiment of the invention the polymer comprises at least one fused aromatic unit and aliphatic unit(s) free of aromatics. In one embodiment of the unit with the aliphatic group, the cycloalkylene group is selected from a biscycloalkylene group, a triscycloalkylene group, a tetracycloalkylene group in which the linkage to the polymer backbone is through the cyclic structure and these cyclic structures form either a monocyclic, a dicyclic or tricyclic structure. In another embodiment of the second polymer, the polymer comprises a unit with the fused aromatic rings and a unit with an aliphatic moiety in the backbone, where the aliphatic moiety is a mixture of unsubstituted alkylene and a substituted alkylene where the substituent may be hydroxy, carboxylic acid, carboxylic ester, alkylether, alkoxy alkyl, alkylaryl, ethers, haloalkyls, alkylcarbonates, alkylaldehydes, ketones and mixtures thereof.

In another embodiment of the underlayer polymer, it comprises at least one unit with 3 or more fused aromatic rings in the backbone of the polymer, at least one unit with an aliphatic moiety in the backbone of the polymer, and at least one unit comprising a group selected from a substituted phenyl, unsubstituted phenyl, unsubstituted biphenyl, substituted biphenyl, substituted naphthyl and unsubstituted naphthyl. The fused aromatic ring with 3 or more aromatic units and the aliphatic moiety are as described herein. The polymer may be free of any pendant moiety containing nitrogen. The polymer may be free of any pendant moiety containing nitrogen, in one embodiment. The substituents on the phenyl, biphenyl and naphthyl may be at least one polar group that increases the solubility of the polymer in a polar solvent, such as ethyl lactate, propyleneglycol monomethyether acetate (PGMEA) and propyleneglycol monomethyether (PGME). Examples of substituents are hydroxy, hydroxyalkyl, halide, etc. The phenyl, biphenyl or naphthyl group may form part of the backbone or be attached to the polymer backbone directly or through a linking group such as a adamantyl group, ethylene group, etc., and where examples of monomeric units may be derived from monomers such as hydroxystyrene, phenol, naphthol, and hydroxynaphthylene. The incorporation of phenol and/or naphthol moieties in the polymer backbone is preferred for films with high carbon content. The amount of the substituted phenylene, unsubstituted phenylene, unsubstituted biphenylene, substituted biphenylene, substituted naphthylene or unsubstituted naphthylene may range from about 5 mole % to about 50 mole % in the polymer, or from about 20 mole % to about 45 mole % in the polymer. Compositions comprising polymers of the present invention which further comprise phenolic and/or naphthol groups are useful when the coating solvent of the composition is PGMEA or a mixture of PGMEA and PGME. Compositions comprising polymers of the present invention which further comprise phenolic and/or naphthol groups are also useful when the excess composition is to be removed with an edgebead remover, especially where the edgebead remover comprises PGMEA or a mixture of PGMEA and PGME. Other edgebead removers comprising ethyl lactate may also be used. In one embodiment the composition comprises a polymer comprising at least one unit with 3 or more fused aromatic rings in the backbone of the polymer, at least one unit with an aliphatic moiety in the backbone of the polymer, and at least one unit comprising a group selected from phenol, naphthol and mixtures thereof. Pyrene, as the fused aromatic moiety, may be used. The composition may further contain a solvent comprising PGMEA. Other additives, as described herein, may be used in the composition.

The weight average molecular weight of the underlayer polymer can range from about 1,000 to about 50,000, or about 1300 to about 20,000. The carbon content of the polymer is greater than 75%, or greater than 80% as measured by elemental analysis, or greater than 85%. The carbon content of the novel antireflective coating composition is greater than 75%, or greater than 80 weight %, or greater than 85 weight % as measured by elemental analysis of the solid content of the composition. A high carbon material allows for faster dry etching of the underlayer thus allowing a thicker hard mask layer to remain over the substrate. Other known types of absorbing antireflective coatings that can act as an underlayer may also be used that are organic and spin coatable. Absorbing antireflective coatings films with a carbon content of greater than 80 weight % are useful.

Any suitable underlayer may be used in the present invention. The underlayer may have a coating in the range of about 150 nm to about 800 nm. The exact thickness is determined by the type of etching process desired. The refractive index (n) of the underlayer is typically in the range of the photoresist which is coated above it and can range from about 1.6 to about 1.85 for dry lithography and for immersion lithography, especially for 193 nm and 248 nm. The absorption value (k) is in the range of about 0.1 to about 0.3 depending on the film thickness of the underlayer, typically referred to as a low absorption material. The n and k values can be calculated using an ellipsometer, such as the J. A. Woollam WVASE VU-32™ Ellipsometer. The exact values of the optimum ranges for k and n are dependent on the exposure wavelength used and the type of application.

The antireflective underlayer coating composition is coated on the substrate using techniques well known to those skilled in the art, such as dipping, spin coating or spraying. The coating is further heated on a hot plate or convection oven for a sufficient length of time to remove any residual solvent and induce crosslinking, and thus insolubilizing the antireflective coating to prevent intermixing between the antireflective coating and the photoresist layer to be coated above it. The preferred range of temperature is from about 90° C. to about 280° C.

A positive photoresist layer (layer 2 in FIGS. 2-5) is formed over the underlayer or coated over the substrate. The particular photoresist used can be any of the types used in the semiconductor industry. Typically the photoactive compound in the photoresist and the antireflective underlayer coating substantially absorb at the exposure wavelength used for the imaging process. Generally positive photoresists are preferred over negative photoresists since they provide higher resolution patterns and are more commonly available.

The present process is particularly suited to deep ultraviolet exposure. Typically chemically amplified photoresists are used. They may be positive photoresists. To date, there are several major radiation exposure technologies that have provided significant advancement in miniaturization, and these are radiation of 248 nm, 193 nm, 157 and 13.5 nm. Photoresists for 248 nm have typically been based on substituted polyhydroxystyrene and its copolymers/onium salts, such as those described in U.S. Pat. Nos. 4,491,628 and 5,350,660. On the other hand, photoresists for exposure below 200 nm require non-aromatic polymers since aromatics are opaque at this wavelength. U.S. Pat. Nos. 5,843,624 and 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. Nos. 6,447,980 and 6,723,488, and incorporated herein by reference.

Photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. Nos. 6,790,587, and 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. Photoresists sensitive to 365 nm and 436 nm may also be used. At the present time 193 nm and EUV photoresists are preferred. Photoresists.useful for imprinting technology may also be used.

The solid components of the photoresist composition are mixed with a solvent or mixtures of solvents that dissolve the solid components of the photoresist. Suitable solvents for the photoresist may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; a ketal or acetal like 1,3 dioxalne and diethoxypropane; lactones such as butyrolactone; an amide derivative such as dimethylacetamide or dimethylformamide, anisole, and mixtures thereof. Typical solvents for photoresist, used as mixtures or alone, that can be used, without limitation, are propylene glycol monomethyl ether acetate (PGMEA), propylene gycol monomethyl ether (PGME), and ethyl lactate (EL), 2-heptanone, cyclopentanone, cyclohexanone, and gamma butyrolactone, but PGME, PGMEA and EL or mixtures thereof are preferred. Solvents with a lower degree of toxicity, good coating and solubility properties are generally preferred.

In one embodiment of the process, the photoresist sensitive to 193 nm is used. The photoresist comprises a polymer, a photoacid generator, and a solvent. The polymer is an (meth) acrylate polymer which is insoluble in an aqueous alkaline developer. Such polymers may comprise units derived from the polymerization of monomers such as alicyclic(meth)acrylates, mevalonic lactone methacrylate, 2-methyl-2-adamantyl methacrylate, 2-adamantyl methacrylate (AdMA), 2-methyl-2-adamantyl acrylate (MAdA), 2-ethyl-2-adamantyl methacrylate (EAdMA), 3,5-dimethyl-7-hydroxy adamantyl methacrylate (DMHAdMA), isoadamantyl methacrylate, hydroxy-1-methacryloxyadamatane (HAdMA). Photoresist polymers comprising at least one lactone group is preferred.

The photoresist may further comprise additives such as basic quenchers, surfactants, dyes, crosslinkers, etc. Useful photoresists are further exemplified and incorporated by reference in U.S. application with Ser. No. 11/834,490 filed Aug. 6, 2007 and US publication number US 2007/0015084 published Jan. 18, 2007.

After the coating process, the photoresist is patterned as is known in the art. Patterning may comprise imagewise exposure with a radiation source and development. The exposure may be done using typical exposure equipment for the particular exposure source. The photoresist may be post exposure baked. The exposed photoresist is then developed in an aqueous developer to remove the treated photoresist. The developer is preferably an aqueous alkaline solution comprising, for example, tetramethyl ammonium hydroxide (TMAH). The developer may further comprise surfactant(s). An optional heating step can be incorporated into the process prior to development and after exposure. The process of coating and imaging photoresists is well known to those skilled in the art and is optimized for the specific type of photoresist used. Typically the thickness of the photoresist is in the range of about 50 nm to about 400 nm for 193 nm exposure. The photoresist patterning is determined by the photoresist used.

The photoresist pattern is then coated with a film of organic polysilazane. In general, polysilazanes are polymers comprising silicon, nitrogen, and carbon moieties. Polysilazanes comprise a Si—N bond. Sometimes polyhydrosilazane is used to refer to a polysilazane additionally comprising at least one Si—H and/or N—H bond. Polysilazane comprises polyhydrosilazane comprising silicon, nitrogen, hydrogen and carbon moieties. Polysilazane includes polyhydrosilaxane. Polysilazanes comprise units selected from linear units of Si—N bonds, cyclic units of Si—N bonds and mixtures thereof. An example of a polysilazane comprises a structure represented by the general formula (8):

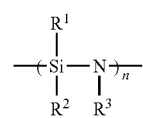

(8)

wherein $R^1$, $R^2$, and $R^3$ are each independently selected from hydrogen and an organic group such as alkyl, alkenyl, cycloalkyl, aryl, aralkyl, fluoroalkyl, an alkylsilyl group, an alkylamino group and an alkoxy group, and n is an integer. In one embodiment of the polymer, the polymer comprises unit of structure 8 provided that at least one of $R_1$, $R^2$, and $R^3$ is a hydrogen atom. The number average molecular weight of the polymer can be about 100 to about 50,000. The alkyl in the above groups may range from 1 carbon to 10 carbons or 1 carbon to 6 carbons. One embodiment of polysilazane is perhydropolysilazane, which comprise a linear structure having a structural unit represented by general formula 9,

(9)

where n is an integer. The linear portion may contain 3 to 10 $SiNH_3$, and have such elemental proportions as determined by chemical analysis that Si: 40 or 59 to 70 or 61% by weight, N: 25 or 31 to 45 or 34% by weight and H: 5 or 6.5 to 15 or 7.5% by weight. The silicon content of the film by solids can be in the range of about 40 to about 70 weight % or about 40 to about 61% by weight or about 59 to about 70 weight %. The perhydropolysilazanes may have number molecular weight in the range of 600 to 10,000. The perhydropolysilazanes may also be those which may be produced by any desired method, and basically may comprise a linear chain part and a cyclic part in its molecule, and may be represented by units of chemical formula (10)

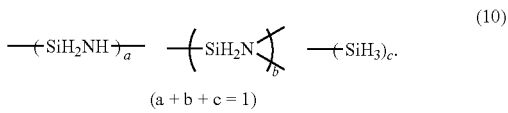

(10)

(a + b + c = 1)

where a, b and c are ratios of the units.

An example of the perhydropolysilazane containing linear and cyclic units is given in structure (11),

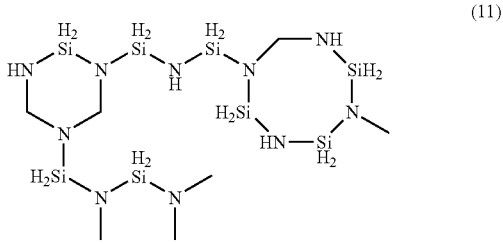

(11)

Further examples of polysilazanes useful according to the present invention include polyorgano(hydro)silazanes represented by general formula (8) wherein,
(i) in structure (8): polysilazanes where, $R^1$ and $R^2$ represent a hydrogen atom and $R^3$ represents an organic group described above, polysilazanes which have a cyclic structure comprising —($R^2$SiNH)— as repeating units and mainly having a degree of polymerization of 3 to 5, polysilazanes which are represented by chemical formula $(R^3SiHNH)_x[(R^2SiH)_{1.5}N]_{1-x}$ wherein $0.4<x<1$ and simultaneously have, in the molecule thereof, a chain structure and a cyclic structure;
(ii) polysilazanes represented by general structure (8) wherein $R^1$ represents a hydrogen atom and $R^2$ and $R^3$ represent an organic group described above; and,
(iii) polysilazanes which have a cyclic structure comprising, as repeating units, —($R^1R^2SiNR^3$)— wherein $R^1$ and $R^2$ represent an organic group and $R^3$ represents a hydrogen atom, and mainly having a degree of polymerization of 3 to 5.

The organic group is exemplified by alkyl, alkenyl, cycloalkyl, aryl, fluoroalkyl, an alkylsilyl group, an alkylamino group and an alkoxy group as described above.

Organic polysilazanes other than those represented by general formula (8) include, for example, polyorgano(hydro)silazanes having, in the molecule thereof, a crosslinked structure represented by general structure (12):

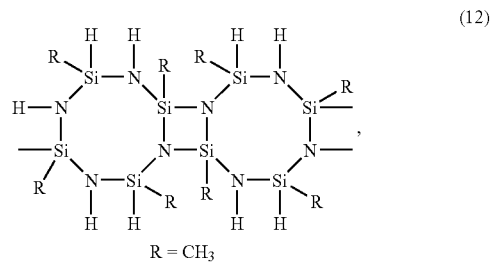

(12)

R = $CH_3$ polysilazanes having a crosslinked structure formed by ammonolysis of $R^1SiX_3$ (X: halogen), and polysilazanes having the structure (8 and 13) prepared by co-ammonolysis of $R^1Si(NH)_x$ or $R^1SiX_3$ and $R^2_2SiX_2$ where $X_2$ and $X_3$ are each independently selected from hydrogen and an organic group such as alkyl, alkenyl, cycloalkyl, aryl, aralkyl, fluoroalkyl, an alkylsilyl group, an alkylamino group and an alkoxy group, and x is an integer ranging from 1, or 2 or 3. The alkyl in the above groups may range from 1 carbon to 10 carbons or 1 carbon to 6 carbons.

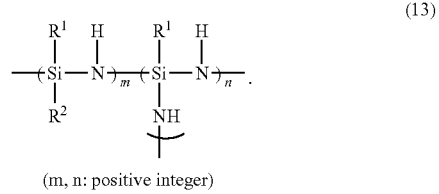

(13)

(m, n: positive integer)

Other polysilazanes include polysiloxazanes comprising repeating units represented by $[(SiH_2)_n(NH)_m]$ and $[(SiH_2)_rO]$ wherein n, m, and r are each independently 1 or 2, or 3; modified polysilazanes prepared by adding an alcohol such as methanol or hexamethyldisilazane to the terminal N atom of perhydropolysilazanes.

Still other polysilazanes include modified polysilazanes, interpolysilazanes, polysilazanes which have been rendered ceramic at a low temperature and to which a catalytic compound for accelerating the conversion of the polysilazane to ceramic has been added or mixed; polysilazanes with a silicon alkoxide added thereto; polysilazanes with glycidol added thereto; polysilazanes with an acetylacetonate complex added thereto; and polysilazane compositions prepared by adding amines or/and acids to the above types of polysilazanes or modification products thereof.

Polysilazane compositions and their application are exemplified in the following patent applications and incorporated herein by reference: U.S. Pat. Nos. 6,767,641, 5,292,830, 5,922,411, 7,344,603 4,965,058, 4,818,611, and 4,869,858. Such polymers may be generally made by reacting a dihalosilane and a base to form an adduct of dihalosilane and then by reacting said adduct with ammonia, as described by the previous references. The weight average molecular weight in terms of styrene as measured by Gel Permeation Chromatography can range from about 1,000 to about 20,000, or about 1,500 to about 15,000.

The polysilazane is dissolved in a coating solvent. The solvent is such that it dissolves the polysilazane and also does not dissolve the photoresist pattern over which the polysilazane solution is coated. Furthermore, the solvent should not react with the polysilazane. Examples of solvents are halogenated hydrocarbon such as methylene chloride, chloroform, carbon tetrachloride, bromoform, ethylene chloride, ethylidene chloride, trichloroethane and tetrachloroethane; ethers such as ethylether, isopropylether, ethylbutylether, butylether, dibutylether, 1,2-dioxyethane, dioxane, dimethyldioxane, tetrahydrofuran, and tetrahydropyran; and other hydrocarbons such as pentane, hexane, isohexane, methylpentane, heptane, isoheptane, octane, decalin, isooctane, cyclopentane, methylcyclopentane, cyclohexane, methylcyclohexane, benzene, toluene, xylene and ethylbenzene. Mixtures of solvents may also be used. The concentration of the polysilazane is adjusted to give the appropriate coating thickness. In general, the content of the polymer is about 0.01 to about 30 weight %, or about 0.3 to about 10 weight % or about 0.3 to about 5 weight % of the total composition. Other additives such as surfactants, leveling agents and plasticizers may be added.

The polysilazane solution is coated over the photoresist pattern using any coating technique such as spin coating, immersion, spraying, etc. The coating is baked to remove the solvent. The baking of the coating may be done in ambient or gaseous environment using conventional equipment, such as hotplate heating oven heating, chamber heating. The temperature for this baking step may range from about 50° C. to about 250° C. for about 10 seconds to 30 minutes, preferably from about 70° C. to about 150° C. The baking may also be done in a humidity chamber to induce the oxidation of the polysilazane to increase the $SiO_2$ content of the polysilazane film and form a silicon hard mask. Oxidative heating may also be carried out. The conditions are optimized to give required properties. After conversion the composition of the film by elemental analysis may be about: Si 40-60%, N 0-30%, O 0-55% and H 0-10% by weight of the solid film. After conversion the converted film contains nitrogen in the range of 0.005 to about 10 or 5% in atomic percentage depending on the degree of conversion. An additional baking step may be included after the polysilazane coating step, which can induce crosslinking in the photoresist and/or densification of the pattern. The additional baking step may range in temperature from about 190° C. to about 250° C. Densification can lead to improved pattern profiles. The thickness of the polysilazane silicon layer is thicker than the photoresist pattern and completely covers the pattern to form a fairly flat, planarized layer. Thickness of the silicon film can range from 50 nm to about 1 micron. Silicon compositions which can form planarizing layers are preferred. The thickness of the silicon layer (A nm) in the pattern region needs to be sufficient to cover the photoresist pattern height (B nm), that is A>B. The thickness of the photoresist pattern (B) can range from about 50 nm to about 200 nm. The thickness of the silicon layer (A) can range from about 70 nm to about 300 nm depending on the thickness of the photoresist layer and the etching process. The difference of A and B is in the range of about 5 nm to about 50 nm.

After the multilayer system is formed with layers 1 optional, 2 and 3, the substrate is placed in a dry etching chamber for carrying out a first fluoro etch, where fluorocarbon and/or fluorinated hydrocarbon gases, such as $CF_4$, $CF_4/O_2$, $C_4F_6$, $C_5F_8$, or other CF gas mixtures with and without oxygen are used to etch back the polysilazane silicon coating. Any suitable fluoroetch for etching the polysilazane coating may be used. The etch back may be at least to the extent that the silicon coating (3) is close to the thickness of the photoresist pattern (FIG. 5), such that the top of the photoresist pattern is visible or detected by an end point detector. Alternatively if the etch back step has higher selectivity for the organic materials the step can proceed further till the photoresist (2) is removed to the top of the underlayer, thereby forming a groove in the first etch step. The first etch step may stop anywhere between the appearance (or level) of the top of the photoresist up to the removal of the photoresist to the under layer or substrate, thus forming a groove, as seen in FIG. 8. The etch rate and etch rate selectivity to the photoresist can be controlled by adding other gases, such as oxygen. Sensors provide the endpoint for the etching or a timed etch can be used if the etch rate and the thickness of the film to be removed are known or derived. The depth of the photoresist layer of the photoresist pattern may be removed during the etch back process by controlling the time of the first etch. Any known conditions may be used for the first etch step.

After the first fluoro etch, a second anisotropic etch is performed to remove the carbonaceous or organic layer(s), photoresist and/or underlayer and thereby forming the groove (4) as shown in FIGS. 6 and 7. In one embodiment, once the top surface of the photoresist is revealed after the first etch, the photoresist and the underlayer can be dry etched in the second oxidative etch step with the silicon layer forming a hard mask, thus reversing the tone of the photoresist pattern (FIGS. 6 and 7). In another embodiment after the groove has been formed in the photoresist in the first etch, the second oxidative etch is used to etch any remaining photoresist and especially the underlayer with the silicon layer forming a hard mask. During the second etch, in an oxygen rich environment, the polysilazane film is further oxidized to a form a film with a higher content of silica, which can function as a silicon hard mask. After the oxidative conversion, if not already converted, the composition of the silicon film by elemental analysis can be about: Si 40-60%, N 0-30%, O 0-55% and H 0-10% by weight of the solid film. After conversion the converted film contains nitrogen in the range of 0.005 to about 10 or 5% in atomic percentage depending on the degree of conversion. The silicon hard mask (SiHM) layer is essentially unetchable in the etching conditions of the second etch and acts as a hard mask for etching the carbonaceous layers. For the second etch step, a gas comprising oxygen and/or hydrogen is useful for etching the photoresist and the underlayer. Additional gases such as argon, helium, xenon, krypton, neon, and combination thereof may be added. The gas mixture may further comprise of other gases such as nitrogen, carbon monoxide, carbon dioxide, sulfur dioxide, $BCl_3$, HBr, $Cl_2$ and a fluorine containing gas such as $NF_3$, $SF_6$, $CF_4$, or combinations thereof to improve the performance. Any known conditions may be used for the second oxidative etch step. The photoresist and the underlayer may be removed in a one continuous process or in 2 separate steps. An anisotropic etch is preferred for etching the photoresist and/or the underlayer, since near vertical sidewall of the groove can be obtained. The width of the groove 4 ($D_2$) in FIGS. 6 and 7 is the width in the silicon hardmask and in certain cases can range from about 10 nm to about 200 nm for the critical structures.

The underlayer/silicon hard mask pattern of the inventive process can be used as a mask to dry etch the substrate in order to form a trench of the desired depth. The present novel process allows for the use of standard high resolution positive photoresists to be used to form reverse tone narrow trenches in the substrate, especially chemically amplified photoresists. The process of dry etching is optimized for the appropriate substrate as in known in the art.

It has been unexpectedly found that when the present polysilazane materials, as described above, are used, the groove 4 dimension, $D_2$, is narrower than would be expected by the dimensions of the photoresist pattern from which the image is transferred. Thus the designed mask opening as defined by the photoresist pattern width has narrowed and can be defined by a certain amount of shrinkage of the opening. This allows for even narrower openings to be defined by the present novel process than the pattered photoresist, which is highly desirable, since smaller geometries in the electronic devices can be built. Although not being bound by theory, it is believed that the silicon film obtained from the polysilazane is expanding or growing under the treatment conditions to narrow the etched photoresist opening. Additionally, controlling the first and second etch steps allows for a method of controlling the shrinkage of the groove opening, as seen in FIG. 8, where the changing groove dimension in the photoresist layer is shown with increasing first etch. The shrinkage is measured as the difference between the width of the photoresist feature ($D_1$) and the width of the actual groove (4) formed in the silicon hard mask after etching ($D_2$). This may also be defined as a shrinkage %=$\{(D_1-D_2)/D_1\}*100$. The shrinkage % can range from about 5 to about 80, or about 5 to about 70, or about 5 to about 50, or about 10 to about 80, or about 10 to about 70, or about 10 to about 50, or about 25 to about 50, or about 35 to about 50, or about 30 to about 50.

Unless otherwise indicated, all numbers expressing quantities of ingredients, properties such as molecular weight, reaction conditions, and so forth used in the specification and claims are to be understood as being modified in all instances by the term "about." Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Example 1

Underlayer Composition

A stock underlayer solution was made by taking 10 g of MX-270 (a crosslinker available from Sanwa Chemical Co. LTD, Hiratsuka Factory, 9-24-8, Tamura Hiratsuka-city Kanagawa Pref. Japan), 90 g of 70/30 poly(methyl methacrylate (MMA)-co-hydroxystyrene(HS)) (70MMA/30HS, from DuPont Corp, 1007 Market Street, Wilmington, Del.) and 40 g of 10% dodecylbenzylsulfonium triethylammonium salt in ArF Thinner and 860 g ArF Thinner (ArF thinner is 70:30 PGME:PGMEA, available from AZ® Electronic Materials USA Corp, 70 Meister Ave., Somerville, N.J.).

A coating composition was prepared by diluting the stock solution with ArF Thinner to a 1:1 ratio by weight. The coating solution was then filtered through 0.2 µm PTFE filter.

Example 2

Photoresist Composition

AZ® AX2110P (a 193 nm photoresist available from AZ® Electronic Materials USA Corp, 70 Meister Ave., Somerville, N.J.) was diluted with AZ® ArF MP Thinner (available from AZ® Electronic Materials USA Corp, 70 Meister Ave., Somerville, N.J.) to a 1:1 ratio by weight. The coating solution was then filtered through 0.2 µm PTFE filter.

Example 3

Polysilizane Composition

A 300 ml four-necked flask was fitted with a gas-inlet tube, mechanical stirrer and Dewar condenser. The reactor was purged with dry oxygen-free nitrogen. 150 ml of dry degassed pyridine was; placed in the flask and cooled with ice. 16.1 g of dichlorosilane was added thereto to form a white, solid adduct ($SiH_2Cl_2.2C_5H_6N$). The reaction mixture was cooled with ice. A mixture of 15.9 g of ammonia purified by passing through a soda lime tube and an active carbon tube and nitrogen gas was introduced into the flask. After completion of the reaction, the solid product was removed by centrifugation followed by filtration. The solvent was removed from the filtrate under reduced pressure (50° C., 5 mmHg, 2 hrs) to obtain 5.62 g of a polysilazane polymer in the form of a glassy solid. The molecular weight was measured by GPC to be 930/1862 (Mn/Mw). Si/N ratio was measured by chemical analysis to be Si/N=1.24.

A dibutylether solution of 3 weight % of perhydropolysilazane from above was made and filtered.

Example 4

Reverse Tone Lithography Stack Preparation

The carbon underlayer coating from Example 1 was spin-coated onto an 8 inch silicon wafer at 1500 rpm and baked at 200° C. for 60 seconds to give a film thickness of 200 nm. Photoresist formulation from Example 2 was coated at 1500 rpm and softbaked at 100° C./60 sec to give a film thickness of 90 nm. This stack was overexposed on an ArF scanner (Nikon NSR-306D: NA=0.85, Dipole Y Illumination, 0.8 s, a/R=0.63, Reticle: 6% HTPSM with a grating composed of 90 nm line space features and 140 nm pillars at a 280 nm pitch interfaced to a TEL Act 12" track, and developed with AZ300MIF (available from AZ® Electronic Materials USA Corp, 70 Meister Ave., Somerville, N.J.) at 23° C. for 30 sec. The layers were postexposure baked at 110° C. for 60 sec. The cross-section from a scanning electron microscope (SEM) pictures of the wafers showed features of 45 nm lines with a 135 nm spaces, and 100 nm pillars at a 280 nm pitch which were patterned by overexposing a 140 nm checkerboard mask pattern with annual illumination (0.82 outer, 0.43 inner sigma), were easily resolved in the overexposure mode.

The polysilazane formulation from Example 3 was coated over the patterned photoresist with a spin speed of 2000 rpm and a subsequent bake at 90° C. for 60 seconds to give a film thickness of 120 nm over the underlayer in the patterned area as measured by SEM.

Example 5

Optimization of First Etch Back Step

Pattern Transfer and Etch Rate Measurements

All image reversal trilayer (IRT) materials were prepared at AZ Electronic Materials. SiHM1 consists of a silsesquioxane resin in PGMEA and was used for the optimization step. Carbon underlayer CUL (Example 1, C content of 70%). Optical indices of CUL were determined using VASE analysis and were n 1.56, k 0.43 at 193 nm.

Etch recipes were optimized on a ULVAC NE-5000N using Inductively Super Magnetron (ISM) technology. Dual 13.56 MHz RF power sources allowed for the generation of excited species to be partially decoupled from the substrates bias. The permanent magnetic field created a high plasma ion density by confining electron to trajectories that increased electron collisions with gas molecules. Wafer temperatures were kept constant at 25° C. using 266 Pa Helium backside cooling.

Etch-back recipe optimization entailed screening different $O_2/CF_4$ gas ratios and ionization power which created a suitable etch time for controlling the process as well as affording an etch selectivity that preferentially removed organics films as compared to the silicon hard mask coating. Etch optimization was carried out using blanket coatings of SiHM1 and CUL as described in the Table 1. Etch rates were then calculated by taking the film thickness difference divided by etch times.

By choosing an organic selective etch (Table 1 entry C) the end point can be easily revealed by X-SEM observation of patterns after specific etch back times. Once the excess SiHM film above the photoresist is removed a dimple forms in the photoresist covered areas. Since anisotropic etching is not required for the first etch, a low wafer power settings was used. However, by controlling the lateral etching of the SiHM during the over etching of the etch back (EB) step, the size of the space can be changed.

Pattern transfer with the image reversal trilayer process turns a photoresist feature width into a recessed hard mask feature width. An additional shrink in the recessed hard mask feature width was found to accompany pattern transfer process which can be used to enhance the resolution of printing very small recessed-like structures. Shrinkage is mainly controlled by the first etchback (EB) step. By changing the degree of EB over etching the degree of shrinkage in the recess feature can be controlled. Shrink is measured from the difference in the width of the photoresist pattern, $D_1$ and width of the SiHM, $D_2$. An example where different amounts of EB over etching and its impact on SiHM shrink is summarized in Table 3 below which uses the etch recipes described in Table 2.

TABLE 1

Screening of EB recipe conditions.

| Example | O2 (SCCM) | CF4 (SCCM) | Top power (W) | SiHM1 (nm/s) | CUL (nm/s) | SiHM1/CUL Selectivity |
|---|---|---|---|---|---|---|
| A | 10 | 50 | 200 | 1.8 | 1.7 | 1.01 |
| B | 30 | 50 | 200 | 2.1 | 3.5 | 0.59 |
| C | 50 | 50 | 200 | 1.7 | 6.1 | 0.28 |
| D | 10 | 50 | 300 | 1.7 | 1.7 | 0.99 |
| E | 30 | 50 | 300 | 2.3 | 3.6 | 0.63 |
| F | 50 | 50 | 300 | 2.2 | 6.1 | 0.37 |
| G | 10 | 50 | 500 | 2.2 | 2.1 | 1.09 |
| H | 30 | 50 | 500 | 3.1 | 4.3 | 0.72 |
| I | 50 | 50 | 500 | 2.9 | 6.2 | 0.47 |

Pressure 5 Pa, etch time 15 sec. Wafer power 100 W.

Example 6

Pattern Transfer

To remove the excess polysilazane film to get to the photoresist surface, wafers with the reverse tone lithography stack were first subjected to a 15 second polysilazane etch back step. This was achieved using a 1:1 $CF_4/O_2$ etch gas combination with the other plasma conditions described in Table 1 Example C. This step opened a 40 nm channel in the center of the photoresist features. The next etch using an oxygen rich second etch, hardened the polysilazane by converting it to a Si, O, N composite silicon hard mask film. An underlayer pattern transfer etch step was achieved using a 15 second $O_2$ etch with the other plasma conditions where the etch conditions are described in Table 2. The groove opening in the silicon hard mask, $D_2$, was measured.

The final etch pattern was a reverse image of the positive photoresist pattern and was also a much thicker and more etch resistant pattern than the photoresist pattern using a reverse image, thus allowing for a better pattern transfer into the substrate than the photoresist pattern of reverse image.

TABLE 2

Reverse tone pattern transfer in the carbon hard mask of photoresist pillars features into contact holes features.

| | First Etch/Etch Back (EB)/sec | | | | | | |
|---|---|---|---|---|---|---|---|
| | 10 | 15 | 20 | 10 | 10 | 15 | 20 |
| | Second etch/CUL etch/sec | | | | | | |
| | 0 | 0 | 0 | 15 | 20 | 15 | 15 |
| $D_2$: SiHM contact hole width/nm | 0 | 40 | 76 | 0 | 20 | 51 | 86 |
| Shrinkage $D_1$-$D_2$ | 96 | 56 | 20 | 96 | 76 | 45 | 10 |
| Shrinkage % | 100 | 58.3 | 20.8 | 100 | 79.2 | 46.9 | 10.4 |

The original photoresist dimension for the pillars $D_1$ is 96 nm. Shrink is calculated as the differences between the

TABLE 2

Optimized etch conditions for reverse tone hard mask pattern transfer steps.

| Transfer step | $O_2$ (SCCM) | $CF_4$ (SCCM) | $N_2$ (SCCM) | Ar (SCCM) | Pressure (Pa) | Top power (W) | Wafer power (W) |
|---|---|---|---|---|---|---|---|
| Polysilazane etch back | 50 | 50 | — | — | 5.0 | 200 | 100 |
| Combined Photoresist removal and underlayer transfer step | 4 | — | 10 | 25 | 0.26 | 200 | 200 |

Reverse tone hard mask etch recipes were optimized on a ULVAC NE-5000N using Inductively Super Magnetron (ISM) technology. Dual 13.56 MHz RF power sources allow for the generation of excited species to be partially decoupled from the substrates bias. A permanent magnetic field helps to increase plasma ion density by confining electron to trajectories which increase the chance of collisions. Wafer temperatures are kept constant at 25° C. using 266 Pa He backside cooling.

Example 7

The above process in Example 6, was repeated using various first and second etch times, thus controlling the opening $D_2$.

dimension of the photoresist line (or pillars) $D_1$ minus the final SiHM trench width, $D_2$ (or contact hole). A shrinkage of 100% meant the groove was not open in the layers.

FIG. 8 shows the etching profile of photoresist with increasing first etch step to control the opening When using SiHM polysilazane the highest shrink (about 70%) was observed when etching was stopped at the end point (no over etching) which did not expose the SiHM wall to the fluorocarbon etching. Further over etching removed the photoresist and eroded the intermixed SiHM walled region and created a controllable range of SiHM openings. Even after complete removal of the photoresist and significant CUL erosion by the EB step a shrink of 10 to 15% was still observed. Thus, shrinking is always present which can be enhanced by decreasing the over etch in the EB step. Further optimization of the shrink may entail improving the anisotropic nature of the EB process to decrease the horizontal etching and assure any CUL erosion is anisotropic. Major shrinkage is not observed with SiHM polysilazane film when the etching is stopped at the end point.

Example 8

Figure 1:
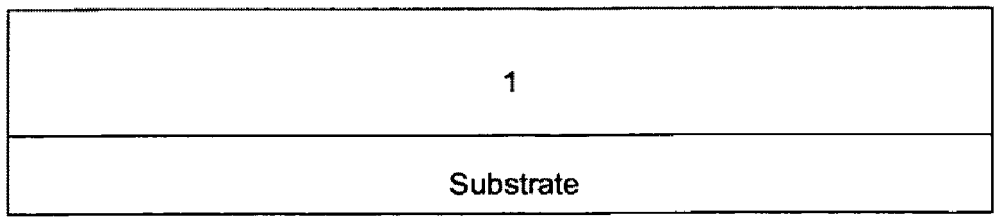
FIG. 1 shows the substrate with an optional underlayer coating (layer 1).
Figure 2:
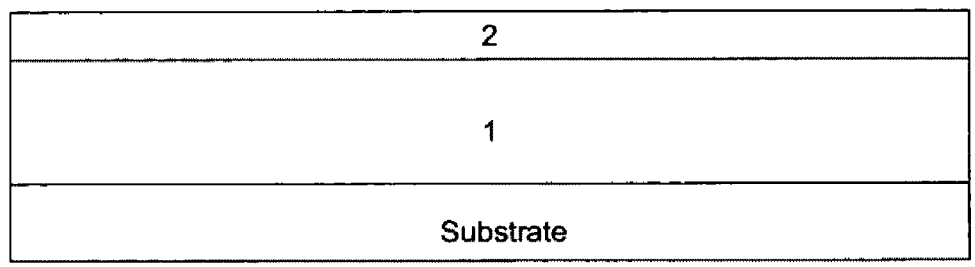
FIG. 2 shows the substrate with a coating of the underlayer (layer 1) and the photoresist (layer 2).
Figure 3:
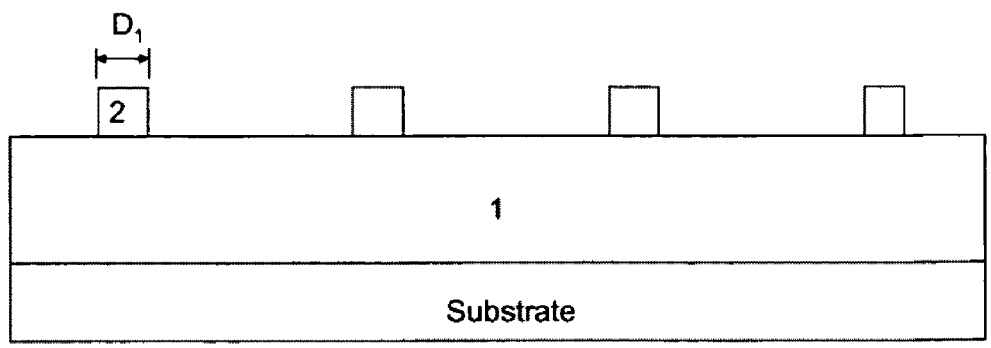
FIG. 3 shows the imaged photoresist over the underlayer.
Figure 4:
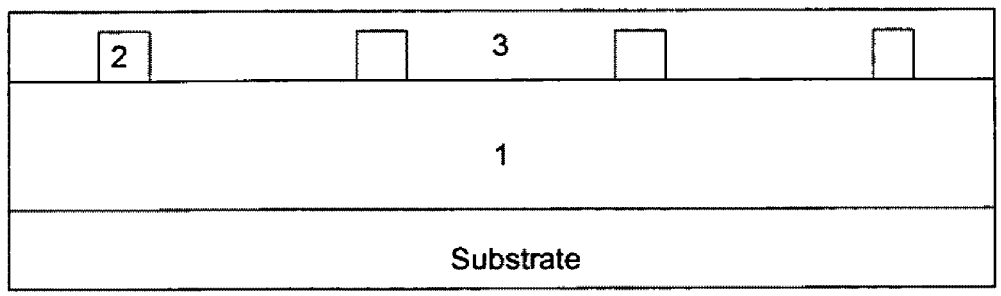
FIG. 4 shows the polysilazane silicon layer (layer 3) coated over the photoresist pattern and underlayer.
Figure 5:
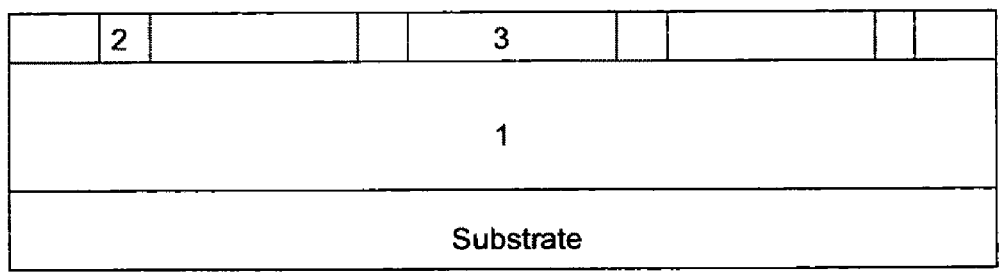
FIG. 5 shows the polysilazane layer has been etched back to where the polysilazane layer has about the same thickness as the photoresist pattern and the top of the photoresist pattern is revealed.

FIG. 1 shows VASE study on the CUL etching of SiHM

FIG. 10 shows the geometric model of SiHM polysilazane swelling during oxidative etching Expansion of the silicon hard mask films while under an oxidative etch also leads to a shrinkage mechanism. Film thickness measurement on blanket coatings of SiHM before and after etching was done using ellipsometric analysis (FIG. 9). Since etching alters the chemical composition of the silicon film, both film thickness and optical indices need to be determined after each film is etched. Many film models were applied to investigate non-uniformities which may exist in the SiHM after etching, but in all cases the best model fits found were those using a generic oscillator (GENOSC) model (available with the VASE Ellipsometer) which is consistent with a compositionally uniform film. Film thickness measurements revealed that there was a film expansion in the first 5 seconds. No observable changes with prolonged etching beyond 5 seconds were apparent in the bulk film with respect to the dispersion curves.

Constant physical ablation of the SiHM is always present throughout the underlayer etching which is evident in the FT trend above 5 seconds in FIG. 9. The initial increase in film thickness is attributed to the oxidation of the film by the plasma. This appears to be a fast process which is essentially complete after less than 10 seconds. After compensating for erosion by ablation, the calculated expansion of the film corresponds to 8.2% of the, SiHM film thickness. This assumes a homogenous and uniform growth. If the horizontal swelling is considered to be the same based on the model in FIG. 10, it is expected that either decreasing the photoresist CD or increasing the pitch leads to more space shrinking since the proportion of SiHM to the space is bigger in either case. The calculated CD changes using the patterns in the examples above are very close to the observed values when considering the cases where the least shrink of SiHM was used.

The invention claimed is:

1. A process for forming a reverse tone image on a device comprising;
  a) optionally, forming an absorbing organic underlayer on a substrate;
  b) forming a coating of a photoresist over the underlayer;
  c) forming a photoresist pattern having a width of the photoresist feature ($D_1$);
  d) forming a polysilazane coating over the photoresist pattern from a polysilazane coating composition, where the polysilazane coating is thicker than the photoresist pattern, and further where the polysilazane coating composition comprises a silicon/nitrogen polymer and an organic coating solvent;
  e) etching the polysilazane coating to remove the polysilazane coating at least up to a level where the top of the photoresist pattern is revealed; and,
  f) dry etching to remove the photoresist and the underlayer which is beneath the photoresist, thereby forming an opening ($D_2$) beneath where the photoresist pattern was present, further where the shrinkage%, $\{(D_1-D_2)/D_1\}*100$, is in a range from about 5 to about 80.

2. The process of claim 1, further comprising a step of dry etching the substrate.

3. The process of claim 1, where the underlayer is present.

4. The process of claim 1, where no underlayer is present.

5. The process of claim 1 where in step f) the dry etching comprises using the same gas composition to remove the photoresist and the underlayer in one continuous step.

6. The process of claim 1 where in step f) the dry etching comprises first removing the photoresist followed by a separate step to remove the underlayer.

7. The process of claim 1 where the polysilazane comprises at least one unit of structure (8),

wherein $R^1$, $R^2$, and $R^3$ are each independently selected from hydrogen, alkyl, alkenyl, cycloalkyl, aryl, fluoroalkyl, an alkylsilyl group, an alkylamino group, an alkoxy group, and n is an integer.

8. The process of claim 1 where the polysilazane comprises at least one unit of structure (8),

wherein $R^1$, $R^2$, and $R^3$ are each independently selected from hydrogen, alkyl, alkenyl, cycloalkyl, aryl, fluoroalkyl, an alkylsilyl group, an alkylamino group, an alkoxy group, n is an integer, and provided that at least one of $R^1$, $R^2$, and $R^3$ is a hydrogen atom.

9. The process of claim 1 where the polysilazane comprises at least one unit of structure (9),

where n is an integer.

10. The process of claim 1, where the underlayer has a carbon content greater than 75 weight%.

11. The process of claim 1, where the imagewise exposure is selected from 248 nm, 193 nm, 157 nm, EUV, e-beam, and imprinting.

12. The process of claim 1, where the dry etching gas in step e) for removing the silicon layer comprises a fluorocarbon.

13. The process of claim 1, where the dry etching gas in step f) comprises oxygen.

14. A product formed by using the process of claim 1.

15. A microelectronic device formed by using a process for forming a reverse tone image on a device comprising;
 a) optionally, forming an absorbing organic underlayer on a substrate;
 b) forming a coating of a photoresist over the underlayer;
 c) forming a photoresist pattern having a width of the photoresist feature ($D_1$);
 d) forming a polysilazane coating over the photoresist pattern from a polysilazane coating composition, where the polysilazane coating is thicker than the photoresist pattern, and further where the polysilazane coating composition comprises a silicon/nitrogen polymer and an organic coating solvent;
 e) etching the polysilazane coating to remove the polysilazane coating at least up to a level where the top of the photoresist pattern is revealed; and, f) dry etching to remove the photoresist and the underlayer which is beneath the photoresist, thereby forming an opening ($D_1$) beneath where the photoresist pattern was present, further where the shrinkag%, $\{(D_1-D_2)/D_1\}*100$, is in a range from about 5 to about 80.

* * * * *